US010714561B2

(12) United States Patent
Gang et al.

(10) Patent No.: US 10,714,561 B2
(45) Date of Patent: Jul. 14, 2020

(54) DISPLAY DEVICE

(71) Applicant: LG Display Co., Ltd., Seoul (KR)

(72) Inventors: Byeonguk Gang, Gyeonggi-do (KR); Jongsik Shim, Gyeonggi-do (KR); Hyunjin Kim, Gyeonggi-do (KR); Joondong Kim, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/034,163

(22) Filed: Jul. 12, 2018

(65) Prior Publication Data

US 2018/0323251 A1 Nov. 8, 2018

Related U.S. Application Data

(62) Division of application No. 15/658,716, filed on Jul. 25, 2017, now Pat. No. 10,038,049.

(30) Foreign Application Priority Data

Jul. 29, 2016 (KR) ........................ 10-2016-0097462

(51) Int. Cl.
*H01L 27/32* (2006.01)

(52) U.S. Cl.
CPC ........ *H01L 27/3276* (2013.01); *H01L 27/322* (2013.01); *H01L 27/3213* (2013.01);
(Continued)

(58) Field of Classification Search
USPC ............ 438/104, 34, 158, 29; 345/174, 694, 345/690–691, 88–89, 211–212, 76;
(Continued)

(56) References Cited

U.S. PATENT DOCUMENTS 9,093,023 B1 * 7/2015 Kim .................... H01L 27/3223
2003/0030381 A1 2/2003 Yamazaki et al.
(Continued)

FOREIGN PATENT DOCUMENTS

CN 1407373 A 4/2003
CN 104752479 A 7/2015
CN 105321986 A 2/2016

OTHER PUBLICATIONS

Notification of First Office Action dated Mar. 31, 2020, issued in corresponding Chinese Patent Application No. 201710630507.9.

*Primary Examiner* — Moin M Rahman
(74) *Attorney, Agent, or Firm* — Morgan, Lewis & Bockius LLP

(57) ABSTRACT

A display device, includes a substrate; first to fourth subpixels sequentially arranged on the substrate; a first power line on a left side of the first subpixel and shared by the first and second subpixels; a sensing line between the second subpixel and the third subpixel and shared by the first to fourth subpixels; a second power line on a right side of the fourth subpixel and shared by the third and fourth subpixels; and a first data line on the left side of the first subpixel, a second data line on a right side of the second subpixel, a third data line on a left side of the third subpixel, and a fourth data line on the right side of the fourth subpixel. The first and second power lines and the sensing line are disposed on a layer different from the first to fourth data lines.

18 Claims, 10 Drawing Sheets

(52) U.S. Cl.
 CPC ...... H01L 27/3258 (2013.01); H01L 27/3272 (2013.01); *H01L 2251/5392* (2013.01)

(58) Field of Classification Search
 USPC .......................... 257/59, 72, 43, 57, 94, 79
 See application file for complete search history.

(56) References Cited

U.S. PATENT DOCUMENTS

| | | |
|---|---|---|
| 2010/0035379 A1 | 2/2010 | Miyairi et al. |
| 2012/0026144 A1* | 2/2012 | Kang .................. G09G 3/3225 345/211 |
| 2012/0139819 A1* | 6/2012 | Tsai .................... G09G 3/3225 345/76 |
| 2015/0187851 A1 | 7/2015 | Lee et al. |
| 2016/0035811 A1 | 2/2016 | Choi et al. |

* cited by examiner

DISPLAY DEVICE

This application is a Divisional of the U.S. patent application Ser. No. 15/658,716, filed Jul. 25, 2017, which claims the priority benefit of Korean Patent Application No. 10-2016-0097462, filed on Jul. 29, 2016, both which are incorporated herein by reference for all purposes as if fully set forth herein.

BACKGROUND

Technical Field

The present disclosure relates to a display device.

Discussion of the Related Art

Various types of flat panel displays (FPDs) have been used to replace heavier and larger cathode ray tubes (CRTs). Examples of the flat panel display include a liquid crystal display (LCD), a field emission display (FED), a plasma display panel (PDP), and an organic light emitting diode (OLED) display.

In more detail, an OLED display is a self-emission display device configured to emit light by exciting an organic compound. The OLED display does not require a backlight unit as needed in a liquid crystal display, and thus, has a thin profile, light weight, and a simple manufacturing process. The OLED display can also be manufactured at a low temperature while still having a fast response time of 1 ms or less, low power consumption, a wide viewing angle, and a high contrast.

Further, the OLED display includes a light emitting layer formed of an organic material between a first electrode serving as an anode and a second electrode serving as a cathode. The OLED display forms hole-electron pairs, i.e., excitons, by combining holes received from the first electrode and electrons received from the second electrode inside the light emitting layer and emits light by energy generated when the excitons return to a ground level.

The OLED display may be classified into a bottom emission OLED display and a top emission OLED display depending on a direction of light emitted from the OLED device. The bottom emission OLED display emits light in a downward direction toward a substrate, i.e., a direction from an emission layer to a first electrode. The top emission OLED display emits light in an upward direction away from a substrate, i.e., a direction from an emission layer to a second electrode.

As display devices are increasingly implemented as high-resolution display devices, smaller-sized pixels are required. Design conditions become limited in a layout in which a circuit is formed within a limited space of a subpixel. In such a case, a short circuit may occur between electrodes, which may result in a defective drive, and an improvement thereof is required.

SUMMARY

Accordingly, embodiments of the present disclosure are directed to a display device that substantially obviates one or more of the problems due to limitations and disadvantages of the related art.

An object of the present disclosure is to provide a display device capable of preventing a short circuit between electrodes resulting from a restriction of limited design conditions on a layout in which a circuit is formed within a limited space of a subpixel when a display panel is implemented as a high-resolution (for example, UHD or higher resolution) display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, a display device comprises a substrate; first to fourth subpixels sequentially arranged on the substrate in a first direction; a first power line on a left side of the first subpixel and shared by the first and second subpixels; a sensing line between the second subpixel and the third subpixel and shared by the first to fourth subpixels; a second power line on a right side of the fourth subpixel and shared by the third and fourth subpixels; a first data line on the left side of the first subpixel, a second data line on a right side of the second subpixel, a third data line on a left side of the third subpixel, and a fourth data line on the right side of the fourth subpixel; and a scan line extended in the first direction, wherein the first and second power lines and the sensing line are disposed on a layer different from the first to fourth data lines.

In another aspect, a method of manufacturing a display device comprises simultaneously forming a first power line, a second power line, a sensing line, and a light shielding layer on a substrate; forming a buffer layer on the first power line, the second power line, the sensing line, and the light shielding layer; forming a gate insulating layer on the buffer layer; and forming an interlayer dielectric layer on the gate insulating layer; forming first to fourth data lines on the interlayer dielectric layer; forming an overcoat layer over the first to fourth data lines; and forming first to fourth subpixels, respectively, on the overcoat layer, wherein the first to fourth subpixels are sequentially adjacent to each other on the substrate in a first direction; wherein the first power line is provided to a left side of the first subpixel and connected with the first and second subpixels; wherein the sensing line is provided between the second subpixel and the third subpixel and connected with the first to fourth subpixels; wherein the second power line is provided to a right side of the fourth subpixel and connected with the third and fourth subpixels; wherein the first data line is provided to the left side of the first subpixel, the second data line is provided to a right side of the second subpixel, the third data line is provided to a left side of the third subpixel, and the fourth data line is provided to the right side of the fourth subpixel; and wherein the scan line is extended in the first direction.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of the respective elements used in the following explanations are selected only for convenience of writing the specification and may be thus different from those used in actual products.

A display device according to an example embodiment may be implemented as an organic light emitting diode (OLED) display, a liquid crystal display (LCD), an electrophoresis display, and the like. Embodiments are described using the OLED display by way of example. An OLED display includes an emission layer that is formed of an organic material between a first electrode serving as an anode and a second electrode serving as a cathode. The OLED display is a self-emission display device configured to form hole-electron pairs, i.e., excitons, by combining holes received from the first electrode and electrons received from the second electrode inside the emission layer and emit light by energy generated when the excitons return to a ground level. The OLED display according to the embodiment may be a plastic display device in which a display element is formed on a flexible plastic substrate rather than a glass substrate.

Figure 1:
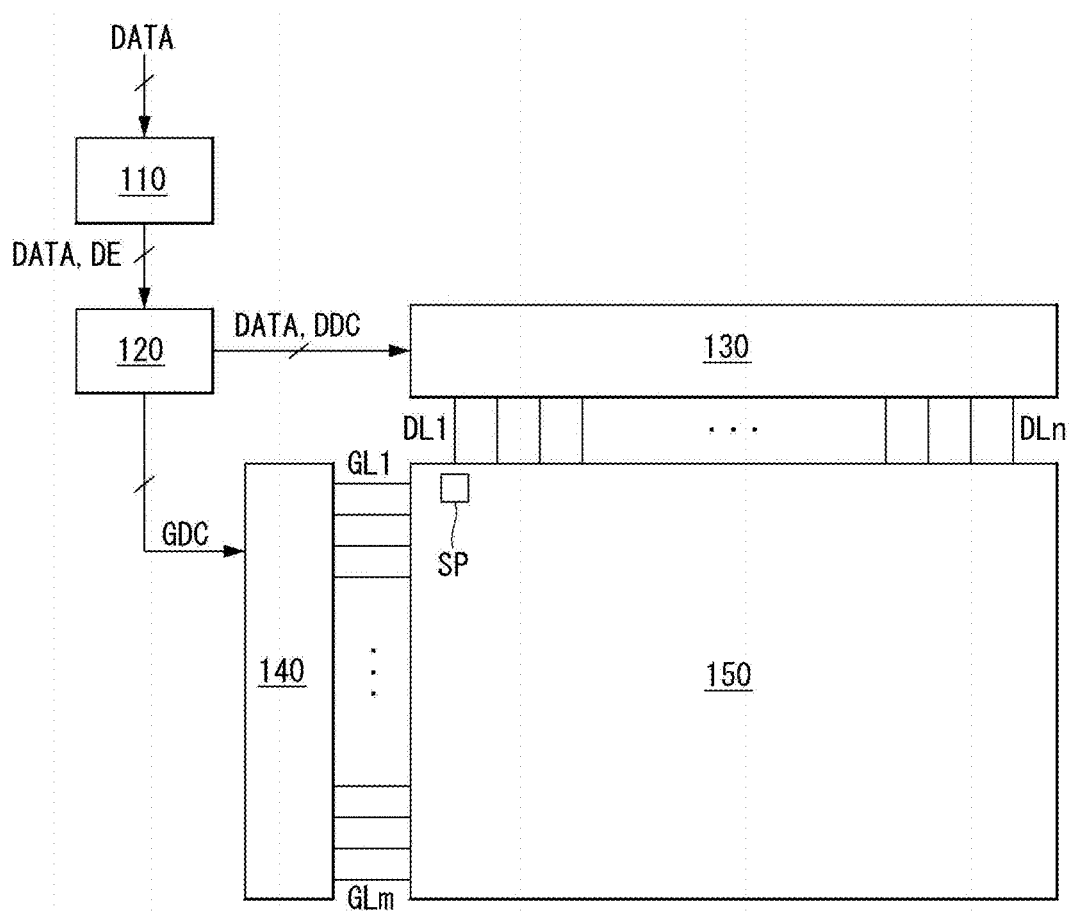
FIG. 1 is a schematic block diagram of an organic light emitting diode (OLED) display according to an example embodiment.
Figure 2:
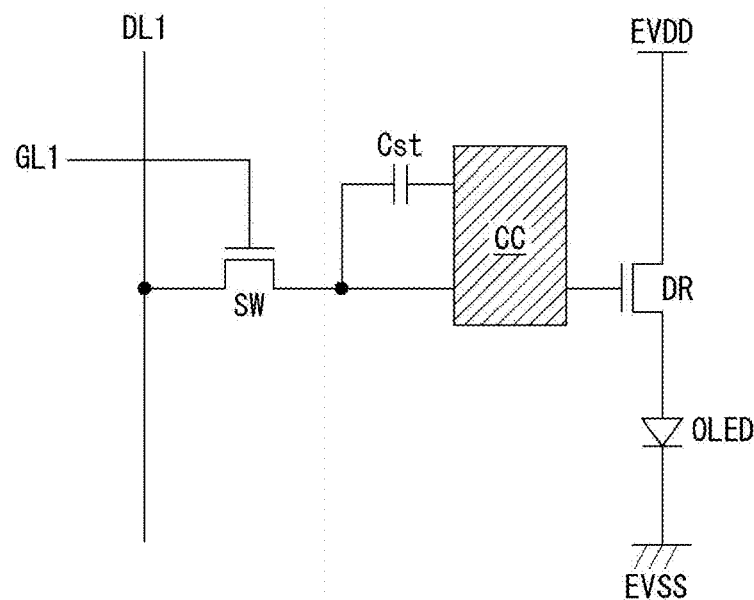
FIG. 2 schematically illustrates a circuit configuration of a subpixel.
Figure 3:
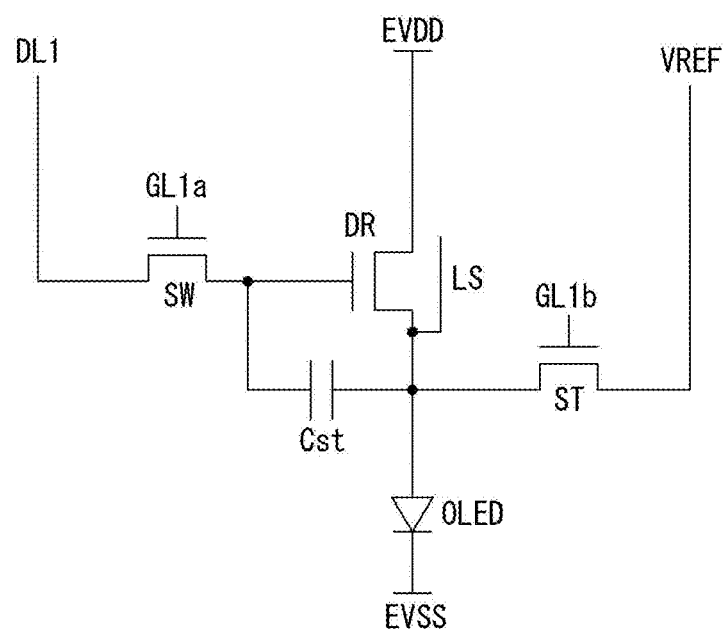
FIG. 3 illustrates a first example of a circuit configuration of a subpixel according to an example embodiment.
Figure 4:
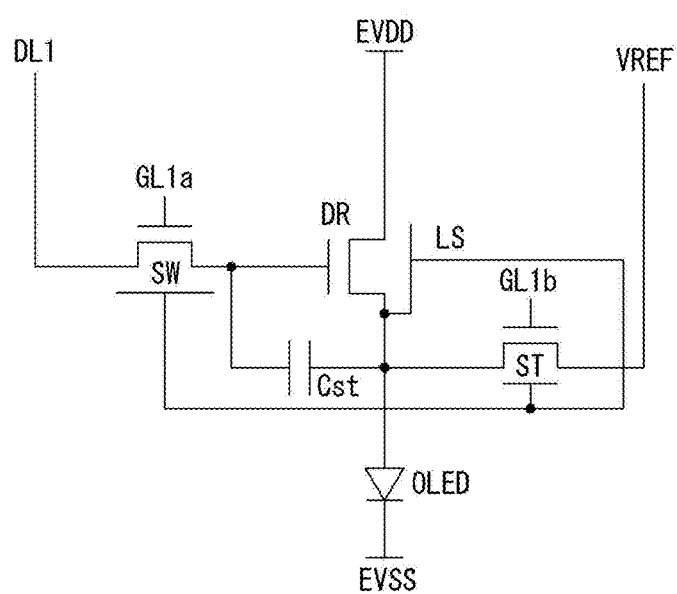
FIG. 4 illustrates a second example of a circuit configuration of a subpixel according to an example embodiment.

FIG. 1 is a block diagram of an OLED display according to an example embodiment. FIG. 2 schematically illustrates a circuit configuration of a subpixel. FIG. 3 illustrates a first example of a circuit configuration of a subpixel according to an example embodiment. FIG. 4 illustrates a second example of a circuit configuration of a subpixel according to an example embodiment.

As shown in FIG. 1, an OLED display according to an example embodiment may include an image processing unit 110, a timing controller 120, a data driver 130, a scan driver 140, and a display panel 150.

The image processing unit 110 outputs a data signal DATA, a data enable signal DE, etc. supplied from the outside. The image processing unit 110 may output one or more of a vertical sync signal, a horizontal sync signal, and a clock signal in addition to the data enable signal DE. For the sake of brevity and ease of reading, these signals are not shown.

The timing controller 120 receives the data signal DATA and driving signals including the data enable signal DE or the vertical sync signal, the horizontal sync signal, the clock signal, etc. from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC received from the timing controller 120 and converts the sampled and latched data signal DATA into a gamma reference voltage. The data driver 130 outputs the data signal DATA to data lines DL1 to DLn. The data driver 130 may be formed in the form of an integrated circuit (IC).

The scan driver 140 outputs a scan signal while shifting a level of a gate voltage in response to the gate timing control signal GDC received from the timing controller 120. The scan driver 140 outputs the scan signal to scan lines GL1 to GLm. The scan driver 140 may be formed in the form of an IC or formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP operated to display an image.

The subpixels SP may be configured in a top emission structure, a bottom emission structure, or a dual emission structure. The subpixels SP may include red subpixels, green subpixels, and blue subpixels, or may include white subpixels, red subpixels, green subpixels, and blue subpixels. Further, the subpixels SP may have one or more different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first scan line GL1. The driving transistor DR enables a driving current to flow between a first power line EVDD and a second power line EVSS based on the data voltage stored in the capacitor Cst. The organic light emitting diode OLED emits light depending on the driving current formed by the driving transistor DR.

The compensation circuit CC is a circuit added to the subpixel and compensates for a threshold voltage of the driving transistor DR. The compensation circuit CC includes one or more transistors. Configuration of the compensation circuit CC may be variously changed depending on a compensation method and is described below with reference to FIGS. 3 and 4.

As shown in FIGS. 3 and 4, the compensation circuit CC includes a sensing transistor ST and a sensing line VREF. The sensing transistor ST is connected to a sensing node between a source line of the driving transistor DR and an anode electrode (or referred to as "first electrode") of the organic light emitting diode OLED. The sensing transistor ST may operate to supply an initialization voltage (or referred to as "sensing voltage") transferred through the sensing line VREF to the sensing node or to sense a voltage or a current of the sensing node.

A source electrode of the switching transistor SW is connected to the first data line DL1, and a drain electrode of the switching transistor SW is connected to a gate electrode of the driving transistor DR. A source electrode of the driving transistor DR is connected to the first power line EVDD, and a drain electrode of the driving transistor DR is connected to the anode electrode of the organic light emitting diode OLED. A lower electrode of the capacitor Cst is connected to the gate electrode of the driving transistor DR, and an upper electrode of the capacitor Cst is connected to the anode electrode of the organic light emitting diode OLED. The anode electrode of the organic light emitting diode OLED is connected to the drain electrode of the driving transistor DR, and a cathode electrode of the organic light emitting diode OLED is connected to the second power line EVSS. A source electrode of the sensing transistor ST is connected to the sensing line VREF, and a drain electrode of the sensing transistor ST is connected to the anode electrode of the organic light emitting diode OLED corresponding to the sensing node.

An operation time of the sensing transistor ST may be similar to (or the same as) or different from that of the switching transistor SW depending on a compensation algorithm (or the configuration of the compensation circuit). For example, a gate electrode of the switching transistor SW may be connected to a 1a scan line GL1a, and a gate electrode of the sensing transistor ST may be connected to a 1b scan line GL1b. As another example, the 1a scan line GL1a connected to the gate electrode of the switching transistor SW and the 1b scan line GL1b connected to the gate electrode of the sensing transistor ST may be commonly connected.

The sensing line VREF may be connected to the data driver. In this instance, the data driver may sense the sensing node of the subpixel during a non-display period of a real-time image or N frame and generate a sensing result, where N is an integer equal to or greater than 1. On the other hand, the switching transistor SW and the sensing transistor ST may be turned on at the same time. In this instance, a sensing operation through the sensing line VREF and a data output operation for outputting the data signal are separated (or distinguished) from each other based on a time division manner of the data driver.

In addition, a target to be compensated based on the sensing result may be a digital data signal, an analog data signal, gamma signal, or the like. The compensation circuit for generating a compensation signal (or a compensation voltage) based on the sensing result may be implemented inside the data driver, inside the timing controller, or inside a separate circuit.

FIGS. 3 and 4 illustrate the subpixel having the configuration of 3T(Transistor)1C(Capacitor) including the switching transistor SW, the driving transistor DR, the capacitor Cst, the organic light emitting diode OLED and the sensing transistor ST, by way of example. However, when the compensation circuit CC is added to the subpixel, the subpixel may have various configurations such as 3T2C, 4T2C, 5T1C and 6T2C.

There is a difference between the subpixel circuit of FIG. 3 and the subpixel circuit of FIG. 4 in configuration of a light shielding layer LS. The light shielding layer LS functions to shield external light. When the light shielding layer LS is formed of a metallic material, a problem that a parasitic voltage is charged is caused. Therefore, the light shielding layer LS is connected to the source electrode of the driving transistor DR.

More specifically, as shown in FIG. 3, the light shielding layer LS may be disposed only below a channel region of the driving transistor DR. Alternatively, as shown in FIG. 4, the light shielding layer LS may be disposed below the channel region of the driving transistor DR and below channel regions of the switching transistor SW and the sensing transistor ST.

The light shielding layer LS may be used for shielding external light as shown in FIG. 3. In addition, the light shielding layer LS may be connected to another electrode or another line and used as an electrode constituting the capacitor, and the like.

A structure of a subpixel array of the display device according to an example embodiment will be described in detail below.

Example Embodiment

Figure 5:
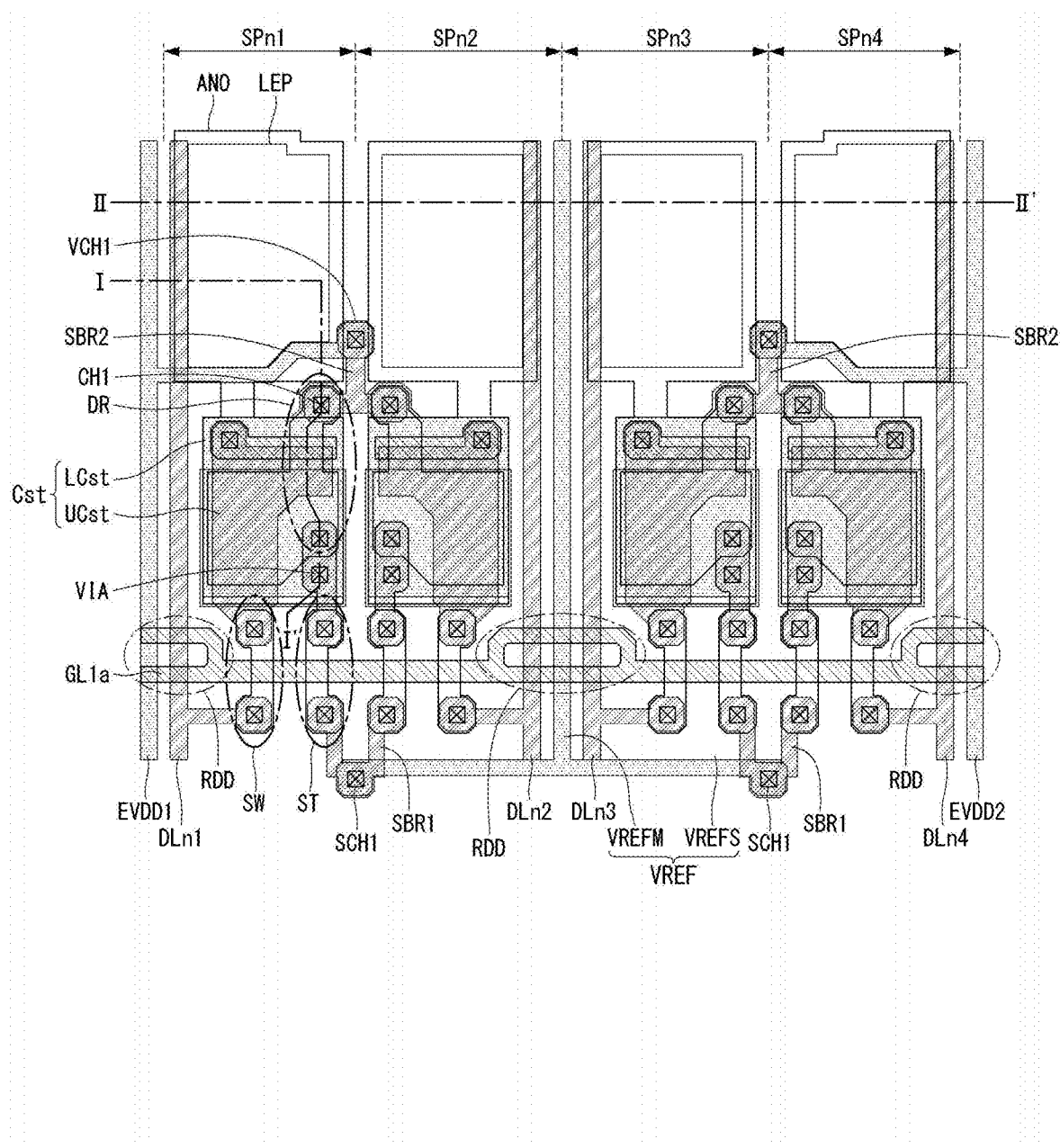
FIG. 5 is a plan view of a subpixel array according to an example embodiment.

FIG. 5 is a plan view of a subpixel array according to an example embodiment.

Figure 6:
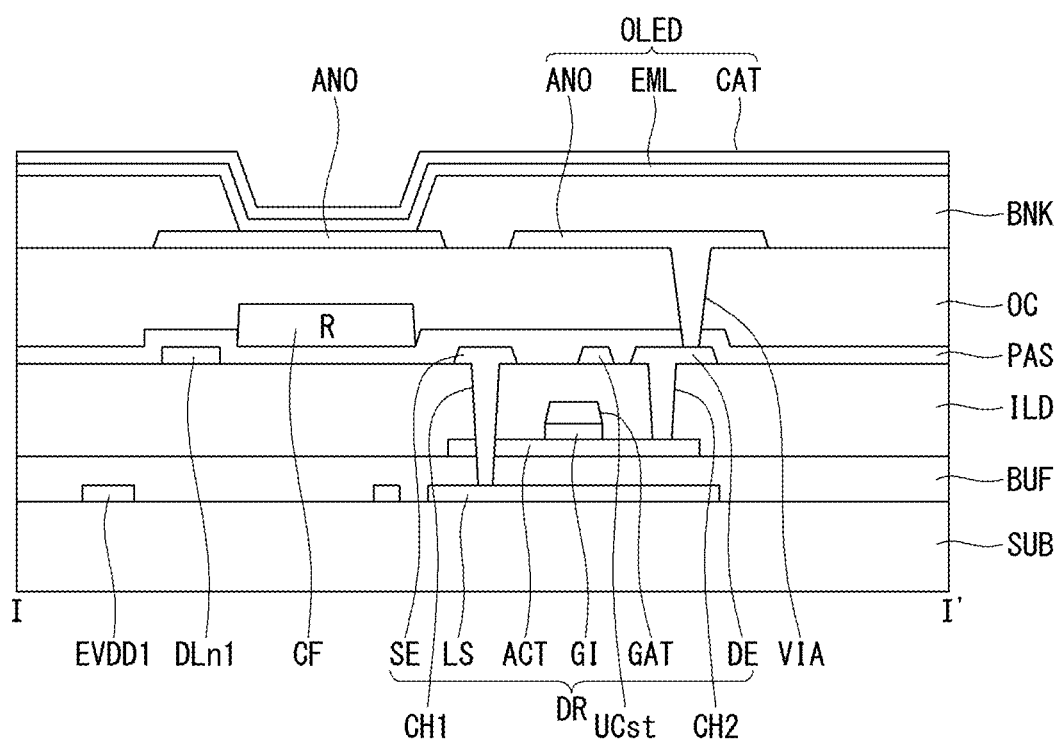
FIG. 6 is a cross-sectional view taken along line I-I' of FIG. 5.
Figure 7:
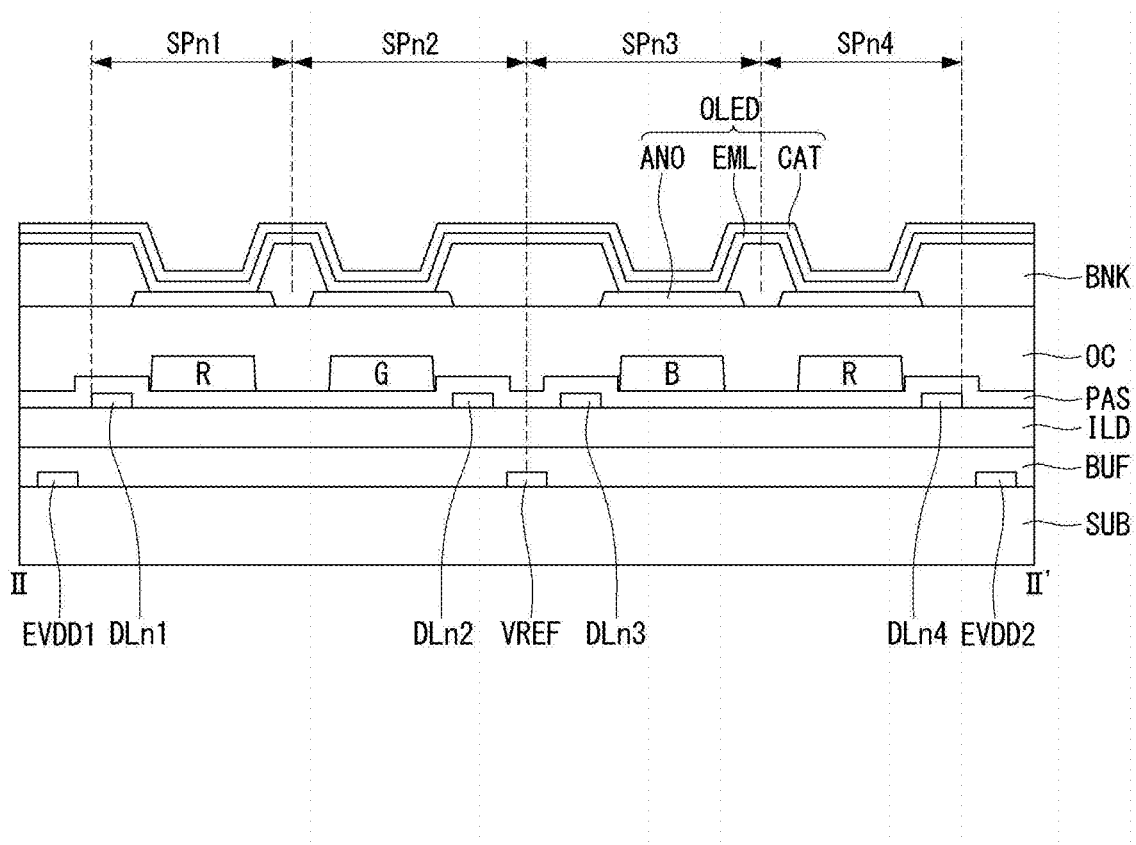
FIG. 7 is a cross-sectional view taken along line II-II' of FIG. 5.
Figure 8:
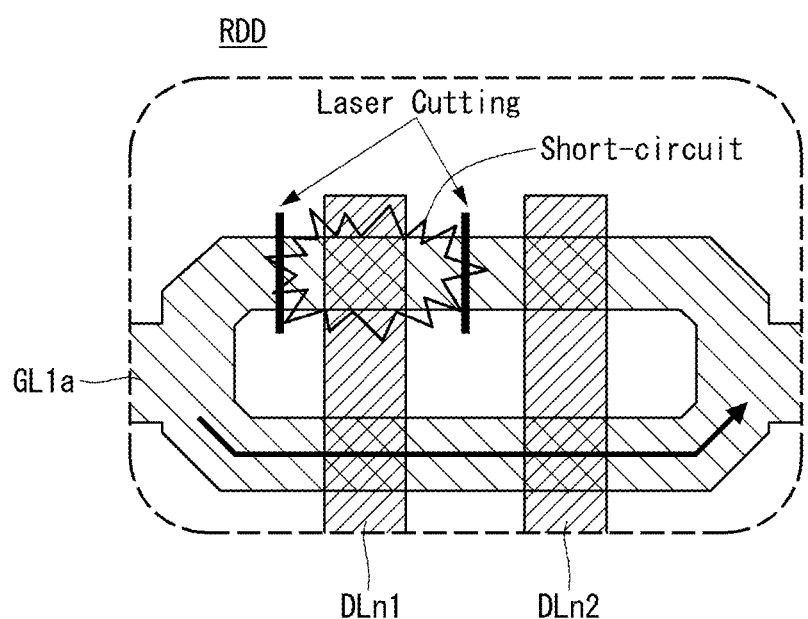
FIG. 8 illustrates a branch portion of a scan line.

FIG. 6 is a cross-sectional view taken along line I-I' of FIG. 5. FIG. 7 is a cross-sectional view taken along line II-II' of FIG. 5. FIG. 8 illustrates a branch portion of a scan line.

With reference to FIG. 5, first to fourth subpixels SPn1 to SPn4 are arranged in a horizontal direction. For example, the first subpixel SPn1 may be a red subpixel R, the second subpixel SPn2 may be a green subpixel G, and the third subpixel SPn3 may be a blue subpixel B. The fourth subpixel SPn4 may be selected as a white subpixel W. In some embodiments, the first to third subpixels SPn1 to SPn3 may form a unit pixel, and three subpixels including the fourth subpixel SPn4 and two subpixels subsequent to the fourth subpixel SPn4 may form a unit pixel. For example, each of RGB, WRG, BWR, and GBW may form a unit pixel. Alternatively, the first to fourth subpixels SPn1 to SPn4 may form a unit pixel, and each of WRGB and WRGB may form a unit pixel.

A first power line EVDD1 is disposed on the left side of the first subpixel SPn1 along a vertical direction. The first power line EVDD1 is commonly connected to the first subpixel SPn1 and the second subpixel SPn2. A second bridge SBR2 is disposed at an end that is extended from the first power line EVDD1 and is positioned between the first and second subpixels SPn1 and SPn2. The first and second subpixels SPn1 and SPn2 are connected to the first power line EVDD1 through the second bridge SBR2. Although not shown, the first power line EVDD1 is commonly connected to two subpixels disposed on the left side of the first power line EVDD1. Namely, the first power line EVDD1 according to the embodiment is commonly connected to four subpixels.

A first data line DLn1 is disposed in an area of the first subpixel SPn1 adjacent to the first power line EVDD1, and a second data line DLn2 is disposed in an area of the second subpixel SPn2 away from the first power line EVDD1. The first data line DLn1 is connected to the first subpixel SPn1, and the second data line DLn2 is connected to the second subpixel SPn2.

A sensing line VREF is disposed between the second subpixel SPn2 and the third subpixel SPn3. The sensing line VREF is commonly connected to the first to fourth subpixels SPn1 to SPn4. The sensing line VREF is disposed between the second data line DLn2 and a third data line DLn3.

The third data line DLn3 is disposed in an area of the third subpixel SPn3 adjacent to the sensing line VREF, and a fourth data line DLn4 is disposed in an area of the fourth subpixel SPn4 away from the sensing line VREF. The third data line DLn3 is connected to the third subpixel SPn3, and the fourth data line DLn4 is connected to the fourth subpixel SPn4. A second power line EVDD2 is disposed on the right side of the fourth subpixel SPn4 along the vertical direction. The second power line EVDD2 is commonly connected to the third subpixel SPn3 and the fourth subpixel SPn4. A second bridge SBR2 is disposed at an end that is extended from the second power line EVDD2 and is positioned between the third and fourth subpixels SPn3 and SPn4. The third and fourth subpixels SPn3 and SPn4 are connected to the second power line EVDD2 through the second bridge SBR2. Although not shown, the second power line EVDD2 is commonly connected to two subpixels disposed on the right side of the second power line EVDD2. Namely, the second power line EVDD2 according to the embodiment is commonly connected to four subpixels.

A scan line GL1a perpendicularly intersecting the sensing line VREF is disposed on the first to fourth subpixels SPn1 to SPn4. The scan line GL1a is connected to gate electrodes of a sensing transistor ST and a switching transistor SW of each of the first to fourth subpixels SPn1 to SPn4. Although one scan line GL1a has been shown and described in embodiments, two scan lines may be provided.

The sensing line VREF includes a vertical sensing line VREFM disposed along the vertical direction and a horizontal sensing line VREFS disposed along the horizontal direction. The vertical sensing line VREFM and the horizontal sensing line VREFS are formed as one body. The vertical sensing line VREFM is disposed in parallel with the second and third data lines DLn2 and DLn3, and the horizontal sensing line VREFS is disposed in parallel with the scan line GL1a. The sensing transistors ST of each of the first to fourth subpixels SPn1 to SPn4 is connected to the vertical sensing line VREFM via the horizontal sensing line VREFS through first bridges SBR1 respectively positioned at both ends of the horizontal sensing line VREFS.

A plan structure of the subpixel is described using the first subpixel SPn1 as an example. The switching transistor SW is disposed at an intersection of the first data line DLn1 and the scan line GL1a. The sensing transistor ST is disposed adjacent to the scan line GL1a and the first bridge SBR1 that is connected to the horizontal sensing line VREFS through a first sensing hole SCH1. The second bridge SBR2 is extended from the first power line EVDD1 and is connected to the first power line EVDD1 through a first power hole VCH1. A capacitor Cst includes a lower capacitor electrode LCst connected to the second bridge SBR2 through a first contact hole CH1 and an upper capacitor electrode UCst extended from a switching transistor ST1. A driving transistor DR is disposed adjacent to the capacitor Cst, and a first electrode ANO is connected to the driving transistor DR through a via hole VIA. An emission unit LEP for emitting light is disposed on the first electrode ANO. Hence, a plan structure of the first subpixel SPn1 is formed.

More specifically, a cross-sectional stricture of the display panel will be described below using a portion of the first subpixel as an example.

With reference to FIGS. 6 and 7, a light shielding layer LS is positioned on a substrate SUB. The light shielding layer LS shields light coming from the outside and prevents a leakage current from being generated in a transistor. Thus, the light shielding layer LS is formed corresponding to a channel region of the driving transistor DR, or is dividedly formed corresponding to channel regions of the driving transistor DR, the sensing transistor ST, and the switching transistor SW.

A buffer layer BUF is positioned on the light shielding layer LS. The buffer layer BUF protects transistors formed in a subsequent process from impurities, for example, alkali ions discharged from the light shielding layer LS or the substrate SUB. The buffer layer BUF may be a silicon oxide (SiOx) layer, a silicon nitride (SiNx) layer, or a multilayer thereof.

A semiconductor layer ACT is positioned on the buffer layer BUF and may be formed of a silicon semiconductor or an oxide semiconductor. The silicon semiconductor may include amorphous silicon or crystallized polycrystalline silicon. The polycrystalline silicon has a high mobility (for example, more than 100 $cm^2/Vs$), low power consumption, and excellent reliability. Thus, the polycrystalline silicon can be applied to a gate driver and/or a multiplexer (MUX) for use in a driving element or applied to a driving transistor of each pixel. Because the oxide semiconductor has a low OFF-current, the oxide semiconductor is suitable for a switching transistor which has a short ON-time and a long OFF-time. Further, because the oxide semiconductor can increase a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be a silicon oxide (SiOx) layer, a silicon nitride (SiNx) layer, or a multilayer thereof. A gate electrode GAT is positioned on the gate insulating layer GI at a location corresponding to a predetermined region (e.g., the channel region when impurities are injected) of the semiconductor layer ACT. The gate electrode GAT may be formed of one of molybdenum (Mo), aluminum (Al), chrome (Cr), gold (Au), titanium (Ti), nickel (Ni), neodymium (Nd), copper (Cu), or a combination thereof. Further, the gate electrode GAT may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GAT may be formed as a double layer of Mo/Al—Nd or Mo/Al.

An interlayer dielectric layer ILD may be positioned on the gate electrode GAT and insulates the gate electrode GAT. The interlayer dielectric layer ILD may be a silicon oxide (SiOx) layer, a silicon nitride (SiNx) layer, or a multilayer thereof. First and second contact holes CH1 and CH2 exposing a portion of the semiconductor layer ACT are formed in a portion of each of the interlayer dielectric layer ILD (and the gate insulating layer GI if the gate insulating layer GI extends over the entire upper surface of the semiconductor layer ACT).

A drain electrode DE and a source electrode SE are positioned on the interlayer dielectric layer ILD. The source electrode SE is connected to the semiconductor layer ACT through the first contact hole CH1 exposing the source region of the semiconductor layer ACT and is also connected to the light shielding layer LS. The drain electrode DE is connected to the semiconductor layer ACT through the second contact hole CH2 exposing the drain region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo. Thus, the driving transistor DR including the semiconductor layer ACT, the gate electrode GAT, the source electrode SE, and the drain electrode DE is formed.

Further, a passivation layer PAS is positioned on the substrate SUB including the driving transistor DR. The passivation layer PAS is an insulating layer protecting the components underlying the passivation layer PAS and may be a silicon oxide (SiOx) layer, a silicon nitride (SiNx) layer, or a multilayer thereof. A color filter CF is positioned on the passivation layer PAS. The color filter CF converts white light emitted by an organic light emitting diode OLED into one selected among red, green, and blue light. In an embodiment disclosed herein, a red color filter CF may be used by way of example. An overcoat layer OC is positioned on the color filter CF. The overcoat layer OC may be a planarization layer for reducing a height difference of an underlying structure and may be formed of an organic material such as polyimide, benzocyclobutene-based resin, and acrylate. The overcoat layer OC may be formed through a spin-on glass (SOG) method for coating the organic material in a liquid state and then curing the organic material.

A via hole VIA exposing the drain electrode DE of the driving transistor DR is positioned in a portion of the overcoat layer OC. The organic light emitting diode OLED is positioned on the overcoat layer OC. More specifically, the organic light emitting diode OLED includes a first electrode ANO on the overcoat layer OC. The first electrode ANO serves as a pixel electrode and is connected to the drain electrode DE of the driving transistor DR through the via hole VIA. The first electrode ANO is an anode electrode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd), or a combination thereof. For example, the reflective layer may be formed of an Ag/Pd/Cu (APC) alloy.

In addition, a bank layer BNK defining pixels is positioned on the substrate SUB including the first electrode ANO. The bank layer BNK may be formed of an organic material such as polyimide, benzocyclobutene-based resin, and acrylate. The bank layer BNK includes a pixel definition portion exposing the first electrode ANO. An emission layer EML contacting the first electrode ANO is positioned in the pixel definition portion of the bank layer BNK. The emission layer EML is a layer, in which electrons and holes combine and emit light. The organic light emitting diode OLED may include a hole injection layer and/or a hole transport layer between the emission layer EML and the first electrode ANO and may include an electron injection layer and/or an electron transport layer on the emission layer EML.

The organic light emitting diode OLED includes a second electrode CAT on the emission layer EML. The second electrode CAT may be positioned on an entire surface of a display area of the substrate SUB. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

With reference to FIGS. 5 to 7, in the embodiment, the first power line EVDD1, the second power line EVDD2, and the sensing line VREF are positioned on the same plane, and are also positioned on the same plane as the light shielding layer LS. Namely, the first power line EVDD1, the second power line EVDD2, the sensing line VREF, and the light shielding layer LS are simultaneously formed using the same material through the patterning. Thus, the first power line EVDD1, the second power line EVDD2, and the sensing line VREF are disposed on a layer different from the first to fourth data lines DLn1 to DLn4. The sensing line VREF is connected to the first bridges SBR1 through the first sensing holes SCH1 penetrating the buffer layer BUF, the gate insulating layer GI, and the interlayer dielectric layer ILD. Further, the sensing line VREF is connected to the sensing transistor ST of each of the first to fourth subpixels SPn1 to SPn4 through the first bridges SBR1. Each of the first power line EVDD1 and the second power line EVDD2 is connected to the second bridges SBR2 through the first power holes VCH1 penetrating the buffer layer BUF, the gate insulating layer GI, and the interlayer dielectric layer ILD. Further, the first power line EVDD1 is connected to the driving transistor DR of each of the first and second subpixels SPn1 and SPn2 through the second bridges SBR2, and the second power line EVDD2 is connected to is connected to the driving transistor DR of each of the third and fourth subpixels SPn3 and SPn4 through the second bridges SBR2.

As described above, in the embodiment, the first power line EVDD1, the second power line EVDD2, and the sensing line VREF are positioned on the same plane as the light shielding layer LS. Because the first power line EVDD1 and the first data line DLn1 are disposed on the different layers in the first subpixel SPn1, the first power line EVDD1 and the first data line DLn1 may be disposed very close to each other without considering a patterning margin. In the same manner as that described above, because the sensing line VREF is disposed on a layer different from the second and third data lines DLn2 and DLn3 in the second and third subpixels SPn2 and SPn3, they may be disposed very close to each other. Further, because the second power line EVDD2 and the fourth data line DLn4 are disposed on the different layers in the fourth subpixel SPn4, they may be disposed very close to each other. Thus, because the power lines, the data lines, and the sensing line are disposed close to each other, a design margin of the first to fourth subpixels SPn1 to SPn4 can be sufficiently secured.

Because the first and second power lines EVDD1 and EVDD2, the first to fourth data lines DLn1 to DLn4, and the sensing line VREF are disposed to intersect the scan line GL1a, they overlap each other at intersections of the lines EVDD1, EVDD2, DLn1 to DLn4, and VREF and the scan line GL1a. The buffer layer BUF is positioned between the first and second power lines EVDD1 and EVDD2 and the sensing line VREF and the scan line GL1a, and the interlayer dielectric layer ILD is positioned between the first to fourth data lines DLn1 to DLn4 and the scan line GL1a. As described above, because one insulating layer is formed between the scan line GL1a and the line overlapping the scan line GL1a, a defective drive is caused when a short circuit is generated between the overlapping lines. Thus, the scan line GL1a includes a branch portion, in order to repair the defective drive when the short circuit is generated between the scan line GL1a and the line overlapping the scan line GL1a.

With reference to FIG. 8, assuming that a predetermined line (for example, the first and second data lines DLn1 and DLn2) overlaps the scan line GL1a, a short circuit may be generated between the first data line DLn1 and the scan line GL1a. In this instance, both ends of a short-circuit generation portion in a branch portion RDD of the scan line GL1a are laser-cut and are disconnected form the branch portion RDD. Thus, a signal of the scan line GL1a is transmitted to another portion (in which the short circuit is not generated) of the branch portion RDD. Hence, the defective drive can be repaired.

With further reference to FIG. 5, the branch portion RDD of the scan line GL1a indicates an area where the scan line GL1a is branched into two parts between the scan line GL1a and the line intersecting the scan line GL1a, and then the two parts are merged into one body again. Namely, the branch portion RDD of the scan line GL1a is positioned in an area where the first power line EVDD1 and the first data line DLn1 intersect the scan line GL1a, and the branch portion RDD of the scan line GL1a is positioned in an area where the second and third data lines DLn2 and DLn3 and the sensing line VREF intersect the scan line GL1a. Further, the branch portion RDD of the scan line GL1a is positioned in an area where the fourth data line DLn4 intersects the scan line GL1a.

However, because the branch portion RDD of the scan line GL1a occupies a large area in the subpixel, there is a difficulty in the design of the subpixels as a resolution of the display panel increases. According to the embodiment, the first power line EVDD1 and the first data line DLn1 are disposed close to each other, the second and third data lines DLn2 and DLn3 and the sensing line VREF are disposed close to each other, and the second power line EVDD2 and the fourth data line DLn4 are disposed close to each other. Thus, because a total of three branch portions RDD of the scan line GL1a are disposed in the first to fourth subpixels SPn1 to SPn4, the number of branch portions RDD of the scan line GL1a can be minimized. As a result, the embodiment can easily design the subpixels and improve an aperture ratio.

Figure 9:
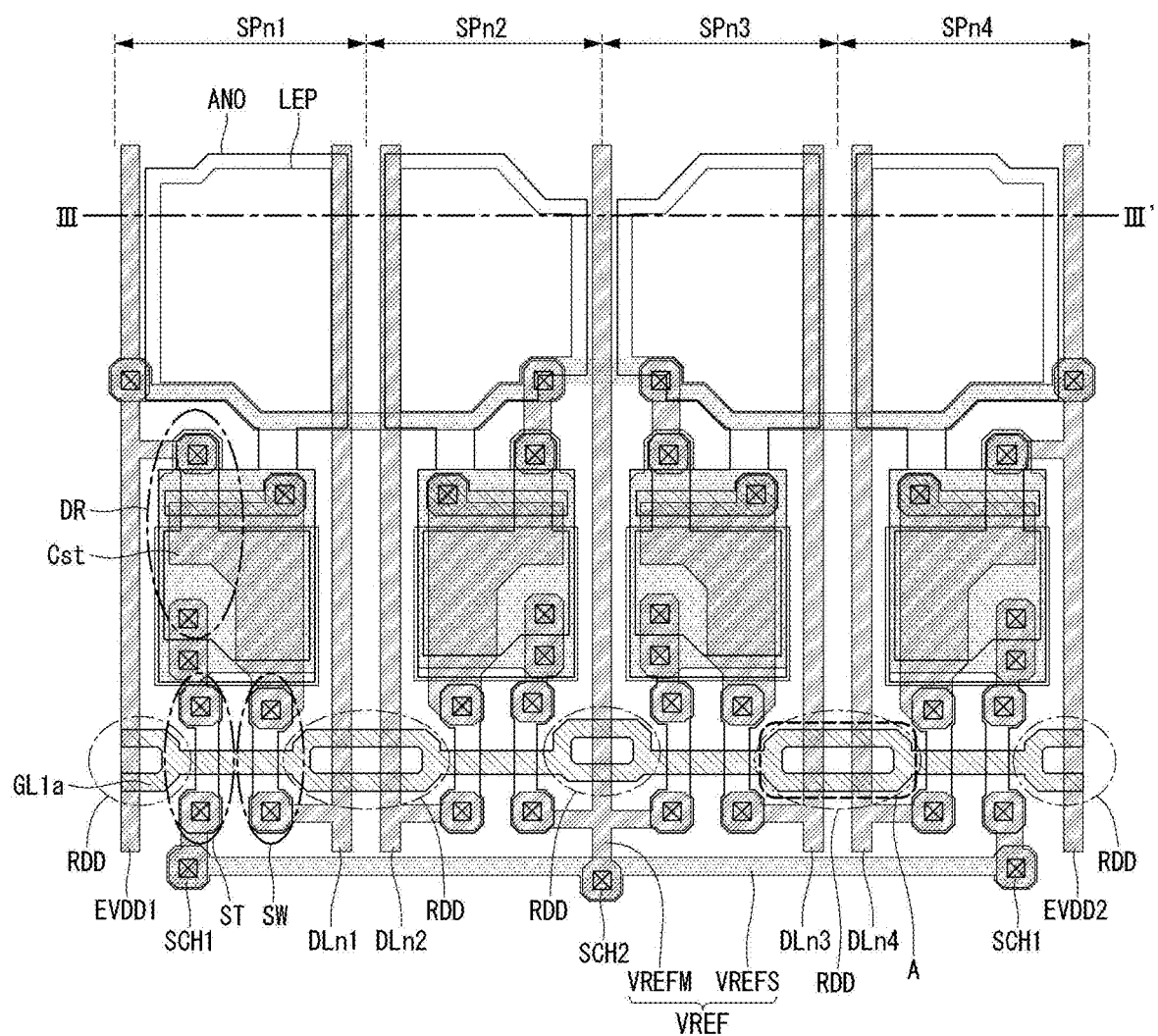
FIG. 9 is a plan view of a subpixel array of a display device according to a comparative example.
Figure 10:
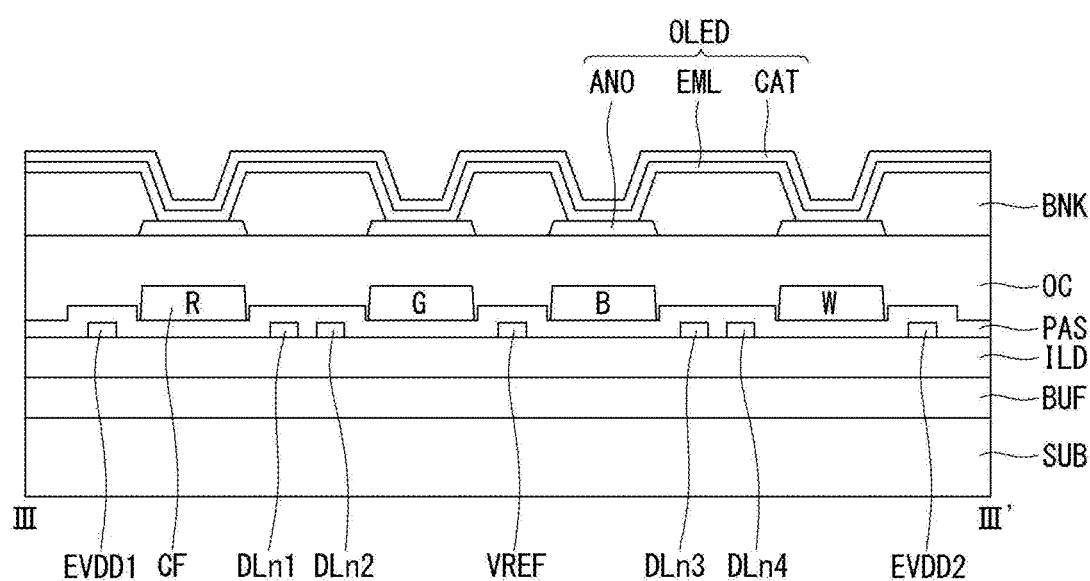
FIG. 10 is a cross-sectional view taken along line III-III' of FIG. 9.
Figure 11:
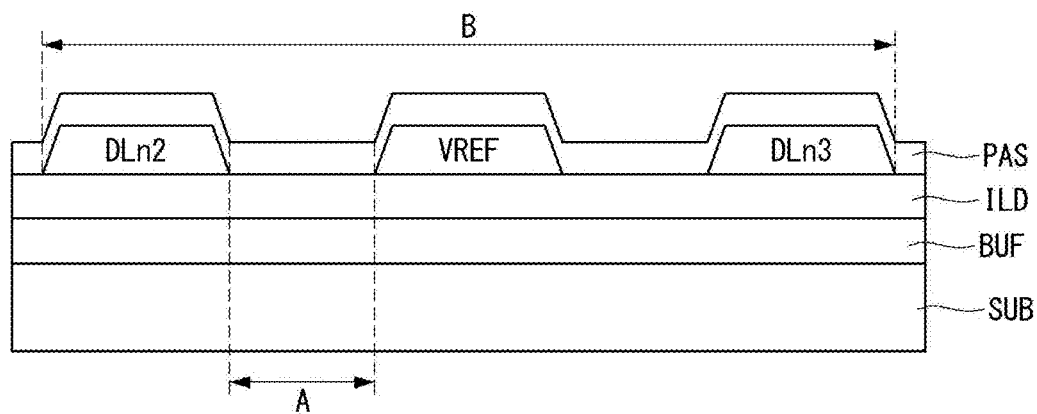
FIG. 11 illustrates a cross-sectional structure of lines according to a comparative example.
Figure 12:
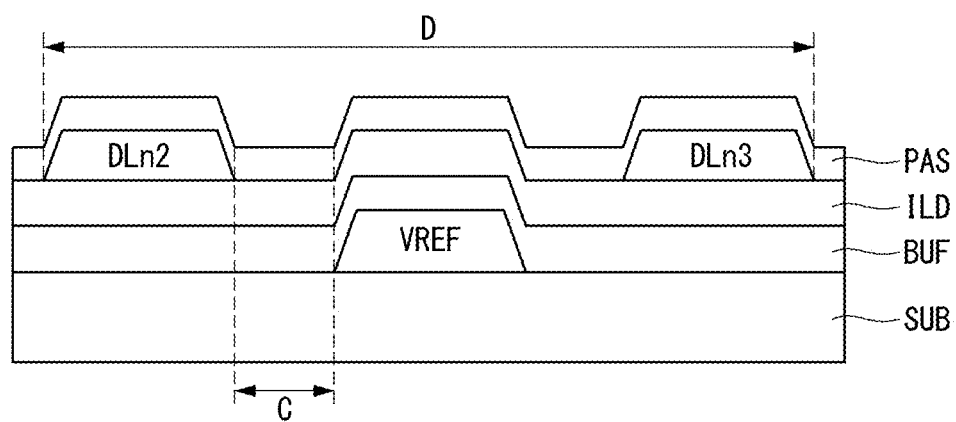
FIG. 12 illustrates a cross-sectional structure of lines according to an example embodiment.

FIG. 9 is a plan view of a subpixel array of a display device according to a comparative example. FIG. 10 is a cross-sectional view taken along line of FIG. 9. FIG. 11 illustrates a cross-sectional structure of lines according to a comparative example. FIG. 12 illustrates a cross-sectional structure of lines according to an example embodiment. In the following description, components having the same configuration as the above embodiment are designated by the same reference numerals, and a description may be briefly made or may be entirely omitted.

Comparative Example

In the example of FIG. 9, first to fourth subpixels SPn1 to SPn4 are arranged in a horizontal direction. A first power line EVDD1 is disposed on the left side of the first subpixel SPn1 along a vertical direction. The first power line EVDD1 is commonly connected to the first subpixel SPn1 and the second subpixel SPn2. A first data line DLn1 and a second data line DLn2 are disposed between the first subpixel SPn1 and the second subpixel SPn2. The first data line DLn1 is connected to the first subpixel SPn1, and the second data line DLn2 is connected to the second subpixel SPn2. A sensing line VREF is disposed between the second subpixel SPn2 and the third subpixel SPn3. The sensing line VREF is commonly connected to the first to fourth subpixels SPn1 to SPn4. A third data line DLn3 and a fourth data line DLn4 are disposed between the third subpixel SPn3 and the fourth subpixel SPn4. The third data line DLn3 is connected to the third subpixel SPn3, and the fourth data line DLn4 is connected to the fourth subpixel SPn4. A second power line EVDD2 is disposed on the right side of the fourth subpixel SPn4 along the vertical direction. The second power line EVDD2 is commonly connected to the third subpixel SPn3 and the fourth subpixel SPn4.

In the example of FIG. 10, a buffer layer BUF, a gate insulating layer GI, and an interlayer dielectric layer ILD are sequentially positioned on a substrate SUB. The first and second power lines EVDD1 and EVDD2, the first to fourth data lines DLn1 to DLn4, and the sensing line VREF are positioned on the interlayer dielectric layer ILD. A passivation layer PAS is disposed on the first and second power lines EVDD1 and EVDD2, the first to fourth data lines DLn1 to DLn4, and the sensing line VREF. Red, green and blue color filters CF are positioned on the passivation layer PAS. An overcoat layer OC is positioned on the color filters CF, and an organic light emitting diode OLED including a first electrode ANO, an emission layer EML, and a second electrode CAT is positioned on the overcoat layer OC. The pixels are defined by a bank layer BNK.

A display device according to the comparative example is configured such that all of the first and second power lines EVDD1 and EVDD2, the first to fourth data lines DLn1 to DLn4, and the sensing line VREF are made of the same material and are positioned on the interlayer dielectric layer ILD. In the comparative example, the sensing line VREF includes a vertical sensing line VREFM and a horizontal sensing line VREFS. Further, in FIG. 9, the vertical sensing line VREFM is connected to the horizontal sensing line VREFS through a second sensing hole SCH2 using an additional layer so that the sensing line VREF does not overlap the data lines.

With further reference to FIG. 9, in the display device according to the comparative example, a total of five branch portions RDD of a scan line GL1a are positioned in the first to fourth subpixels SPn1 to SPn4. Hence, the comparative example is disadvantageous in the design of subpixels and an aperture ratio. Thus, as in the embodiment illustrated in FIG. 5, the first data line may be disposed adjacent to the first power line, the second and third data lines may be disposed adjacent to the sensing line, and the fourth data line may be be disposed adjacent to the second power line. As a result, the number of branch portions of the scan line can decrease.

However, with reference to FIG. 11, in the display device according to the comparative example, because the data lines, for example, the second and third data lines DLn2 and DLn3 and the sensing line VREF are positioned on the same layer, the second data line DLn2 and the sensing line VREF may be spaced apart from each other by a first distance A in consideration of a patterning margin. Thus, a second distance B from the second data line DLn2 to the third data line DLn3 via the sensing line VREF increases.

On the other hand, with reference to FIG. 12, the display device according to example embodiments according to the present disclosure does not need to consider the patterning margin because the second and third data lines DLn2 and DLn3 and the sensing line VREF are positioned on the different layers. Hence, the second data line DLn2 and the sensing line VREF may be spaced apart from each other by a third distance C less than the first distance A of the comparative example. Further, a distance D from the second data line DLn2 to the third data line DLn3 via the sensing line VREF is less than the second distance B of the comparative example.

The display device according to example embodiments according to the present disclosure is configured such that the vertically arranged lines are disposed close to one another by forming the sensing line and the power lines on the same layer as the light shielding layer. Hence, the configuration of the display device can facilitate design of the subpixels with high density and improve the aperture ratio by reducing the number of branch portions of the scan line.

The following Table 1 indicates an aperture ratio of a subpixel according to the comparative example and an aperture ratio of a subpixel according to the example embodiment.

TABLE 1

|  | Arrangement of Unit pixel | Comparative Example | Example Embodiment |
|---|---|---|---|
| Aperture ratio (%) | RGB/WRG/BWR | 22.5 | 23.6 |
|  | WRGB/WRGB | Impossible to design | 16.0 |

As indicated by the above Table 1, when a unit pixel had an arrangement of RGB/WRG/BWR, an aperture ratio according to the example embodiment was increased by 1.1% compared to the comparative example. Further, when the unit pixel had an arrangement of WRGB, the design of the aperture ratio was impossible in the comparative example, but the aperture ratio of 16% was designed in the example embodiment.

As described above, the display device according to the example embodiment is configured such that the vertically arranged lines are disposed close to one another by forming the sensing line and the power lines on the same layer as the light shielding layer. Hence, the display device according to the example embodiment can easily design the subpixels and improve the aperture ratio by reducing the number of branch portions of the scan line.

It will be apparent to those skilled in the art that various modifications and variations can be made in the display device of the present disclosure without departing from the spirit or scope of the invention. Thus, it is intended that the present disclosure cover the modifications and variations provided they come within the scope of the appended claims and their equivalents.

What is claimed is:

1. A display device, comprising:
   a substrate;
   first to fourth subpixels sequentially arranged on the substrate in a first direction;
   a first power line on a left side of the first subpixel and shared by the first and second subpixels;
   a sensing line between the second subpixel and the third subpixel and shared by the first to fourth subpixels;
   a second power line on a right side of the fourth subpixel and shared by the third and fourth subpixels;
   a first data line on the left side of the first subpixel, a second data line on a right side of the second subpixel, a third data line on a left side of the third subpixel, and a fourth data line on the right side of the fourth subpixel; and
   a scan line extended in the first direction,
   wherein the first and second power lines and the sensing line are disposed on a layer different from another layer on which the first to fourth data lines are disposed, and
   wherein the first power line, the second power line, and the sensing line are positioned on a same plane.

2. The display device of claim 1, wherein the sensing line is between the second data line and the third data line with respect to the first direction.

3. The display device of claim 1, wherein the first power line and the first data line are adjacent to each other,
   wherein the second data line, the sensing line, and the third data line are adjacent to one another, and
   wherein the fourth data line and the second power line are adjacent to each other.

4. The display device of claim 3, wherein a first branch portion of the scan line is in an area where the first power line and the first data line cross the scan line, wherein a second branch portion of the scan line is in an area where the second data line, the sensing line, and the third data line cross the scan line, and wherein a third branch portion of the scan line is in an area where the fourth data line and the second power line cross the scan line.

5. The display device of claim 4,
   wherein the first branch portion is configured to correct a short circuit if a short circuit occurs between the scan line and at least one of the first power line and first data line;
   wherein the second branch portion is configured to correct a short circuit if a short circuit occurs between the scan line and at least one of the second data line, the sensing line, and the third data line; and
   wherein the third branch portion is configured to correct a short circuit if a short circuit occurs between the scan line and at least one of the fourth data line and the second power line.

6. The display device of claim 1, wherein the sensing line includes a vertical sensing line and a horizontal sensing line, and
   wherein the vertical sensing line is disposed in parallel with the second and third data lines, and the horizontal sensing line is disposed in parallel with the scan line.

7. The display device of claim 6, wherein the vertical sensing line and the horizontal sensing line are integral with each other.

8. The display device of claim 6, wherein the sensing line is connected to each of the first to fourth subpixels through first bridges respectively positioned at both ends of the horizontal sensing line.

9. The display device of claim 1, further comprising second bridges respectively provided at an end of a first extension that is extended from the first power line, and an end of a second extension that is extended from the second power line,
   wherein the second bridges connect the first power line to the first and second subpixels and connect the second power line to the third and fourth subpixels.

10. The display device of claim 1, further comprising:
    a light shielding layer on the substrate;
    wherein the light shielding layer, the first power line, the second power line, and the sensing line are positioned on a same plane.

11. The display device of claim 1, further comprising:
    a buffer layer on the first power line, the second power line, and the sensing line;
    an interlayer dielectric layer on the buffer layer, wherein the first to fourth data lines are positioned on the interlayer dielectric layer such that the buffer layer and the interlayer dielectric layer are between the first to fourth data lines and the first to second power lines.

12. The display device of claim 11, wherein the first power line, the second power line, and the sensing line are on the substrate and covered by the buffer layer.

13. The display device of claim 1, wherein the first power line, the second power line, and the sensing line are formed of a same material.

14. The display device of claim 1, wherein each of the first to fourth subpixels includes a switching transistor connected to the scan line, a sensing transistor connected to the sensing line, and a driving transistor connected to the first power line or the second power line.

15. The display device of claim 1, wherein the first to fourth subpixels are sequentially adjacent to each other on the substrate.

16. The display device of claim 1, wherein the first data line is connected with the first subpixel, the second data line is connected with the second subpixel, the third data line is connected with the third subpixel, and the fourth data line is connected with the fourth subpixel.

17. A display device, comprising:
a substrate;
first to fourth subpixels sequentially arranged on the substrate in a first direction;
a first power line on a left side of the first subpixel and shared by the first and second subpixels;
a sensing line between the second subpixel and the third subpixel and shared by the first to fourth subpixels;
a second power line on a right side of the fourth subpixel and shared by the third and fourth subpixels;
a first data line on the left side of the first subpixel, a second data line on a right side of the second subpixel, a third data line on a left side of the third subpixel, and a fourth data line on the right side of the fourth subpixel; and
a scan line extended in the first direction,
wherein the first and second power lines and the sensing line are disposed on a layer different from another layer on which the first to fourth data lines are disposed,
wherein the first power line and the first data line are adjacent to each other,
wherein the second data line, the sensing line, and the third data line are adjacent to one another, and
wherein the fourth data line and the second power line are adjacent to each other.

18. A display device, comprising:
a substrate;
first to fourth subpixels sequentially arranged on the substrate in a first direction;
a first power line on a left side of the first subpixel and shared by the first and second subpixels;
a sensing line between the second subpixel and the third subpixel and shared by the first to fourth subpixels;
a second power line on a right side of the fourth subpixel and shared by the third and fourth subpixels;
a first data line on the left side of the first subpixel, a second data line on a right side of the second subpixel, a third data line on a left side of the third subpixel, and a fourth data line on the right side of the fourth subpixel; and
a scan line extended in the first direction,
wherein the first and second power lines and the sensing line are disposed on a layer different from another layer on which the first to fourth data lines are disposed,
wherein the sensing line includes a vertical sensing line and a horizontal sensing line, and
wherein the vertical sensing line is disposed in parallel with the second and third data lines, and the horizontal sensing line is disposed in parallel with the scan line.

\* \* \* \* \*